(12) United States Patent
Morimoto et al.

(10) Patent No.: US 11,871,542 B2
(45) Date of Patent: Jan. 9, 2024

(54) USER DEVICE AND CASE

(71) Applicant: Resonac Corporation, Tokyo (JP)

(72) Inventors: Tsuyoshi Morimoto, Tokyo (JP); Naoki Furukawa, Tokyo (JP); Atsuko Sano, Tokyo (JP); Hiroshi Yokota, Tokyo (JP)

( * ) Notice: Subject to any disclaimer, the term of this patent is extended or adjusted under 35 U.S.C. 154(b) by 80 days.

(21) Appl. No.: 17/619,307

(22) PCT Filed: Jun. 16, 2020

(86) PCT No.: PCT/JP2020/023573
§ 371 (c)(1),
(2) Date: Dec. 15, 2021

(87) PCT Pub. No.: WO2020/255952
PCT Pub. Date: Dec. 24, 2020

(65) Prior Publication Data
US 2022/0377930 A1 Nov. 24, 2022

(30) Foreign Application Priority Data
Jun. 19, 2019 (JP) .................................. 2019-113829

(51) Int. Cl.
*H05K 7/20* (2006.01)
*H05K 5/00* (2006.01)
*H04M 1/02* (2006.01)

(52) U.S. Cl.
CPC ......... *H05K 7/2039* (2013.01); *H05K 5/0086* (2013.01); *H05K 7/20963* (2013.01); *H04M 1/026* (2013.01)

(58) Field of Classification Search
CPC .............. H05K 7/2039; H05K 5/0086; H05K 7/20963; H04M 1/026
See application file for complete search history.

(56) References Cited

U.S. PATENT DOCUMENTS

| | | | | |
|---|---|---|---|---|
| 2003/0066672 | A1* | 4/2003 | Watchko | C23C 4/00 174/50 |
| 2003/0157342 | A1* | 8/2003 | Myers | H01L 23/29 257/E23.117 |
| 2004/0252454 | A1* | 12/2004 | Chen | G06F 1/203 361/708 |
| 2005/0111189 | A1* | 5/2005 | Smalc | G06F 1/182 257/722 |
| 2005/0270746 | A1* | 12/2005 | Reis | H01L 23/3675 361/708 |

(Continued)

FOREIGN PATENT DOCUMENTS

| | | |
|---|---|---|
| JP | 2016-201580 | 12/2016 |
| JP | 2018-170745 | 11/2018 |

OTHER PUBLICATIONS

International Search Report dated Sep. 24, 2020 for PCT/JP2020/023573.

(Continued)

*Primary Examiner* — Michael A Matey
(74) *Attorney, Agent, or Firm* — SOEI PATENT & LAW FIRM (57) ABSTRACT

A user device that can be touched by a user includes a heat source that can generate heat; a case body covering the heat source; and a polymer-containing heat storage body attached to the case body.

10 Claims, 11 Drawing Sheets

(56) References Cited

U.S. PATENT DOCUMENTS

| | | | | |
|---|---|---|---|---|
| 2010/0126708 A1* | 5/2010 | Mikami | ............... | H04B 1/036 |
| | | | | 165/185 |
| 2011/0251733 A1* | 10/2011 | Atkinson | ............. | G06F 1/3203 |
| | | | | 700/300 |
| 2014/0002998 A1* | 1/2014 | Pidwerbecki | ........ | H05K 1/0209 |
| | | | | 29/841 |
| 2014/0118928 A1* | 5/2014 | Cheng | ................... | G06F 1/203 |
| | | | | 165/170 |
| 2014/0268579 A1* | 9/2014 | Nguyen | ................ | G06F 1/203 |
| | | | | 165/185 |
| 2014/0285967 A1* | 9/2014 | Wikander | ............... | H05K 3/00 |
| | | | | 361/705 |
| 2015/0268704 A1* | 9/2015 | Chiriac | .................. | F28F 21/00 |
| | | | | 165/185 |
| 2015/0350392 A1* | 12/2015 | Park | .................. | H05K 7/20336 |
| | | | | 455/575.6 |
| 2016/0156213 A1* | 6/2016 | Yajima | ............... | H01M 10/623 |
| | | | | 320/152 |
| 2016/0192541 A1* | 6/2016 | Rech | ................ | H05K 7/20409 |
| | | | | 361/709 |
| 2017/0155746 A1* | 6/2017 | Yang | ...................... | G06F 1/203 |
| 2018/0068926 A1* | 3/2018 | Krajniak | ............ | H01L 23/3737 |
| 2018/0076112 A1* | 3/2018 | Dabral | .................... | H01L 23/13 |
| 2019/0082555 A1* | 3/2019 | Hooton | ................... | B41M 5/24 |
| 2020/0150732 A1* | 5/2020 | Li | ........................... | F28D 20/02 |
| 2021/0392748 A1* | 12/2021 | Grigsby | ................ | H05K 3/284 |

OTHER PUBLICATIONS

International Preliminary Report on Patentability with Written Opinion dated Dec. 30, 2021 for PCT/JP2020/023573.

* cited by examiner

USER DEVICE AND CASE

CROSS-REFERENCE TO RELATED APPLICATIONS

This application is a 35 U.S.C. § 371 national phase application of PCT/JP2020/023573, filed on Jun. 16, 2020, which claims priority to Japanese Patent Application No. 2019-113829, filed on Jun. 19, 2019.

TECHNICAL FIELD

The present disclosure relates to a user device and a case fitted to the user device.

BACKGROUND ART

There are user devices that are used in a state of being touched by users, such as smartphones, for example. Such a user device may be provided inside the device with a heat source such as a semiconductor chip that generates heat. For this reason, in the user device, measures are taken to prevent a user from feeling hot even if the user touches the user device. For example, Patent Literature 1 describes a case that is fitted to a smartphone having a heat source. This case is provided with a heat conductor which transfers the heat generated in a smartphone to parts that are not grabbed by the user.

CITATION LIST

Patent Literature

Patent Literature 1: Japanese Unexamined Patent Publication No. 2016-201580

SUMMARY OF INVENTION

Technical Problem

In such user devices, in recent years, the amount of heat generation from a heat source such as a semiconductor chip tends to increase due to an increase in the amount of computation or the like. For this reason, in the present technical field, a configuration that may suppress rapid release of heat generated from a heat source is desired.

Solution to Problem

According to an aspect of the present disclosure, there is provided a user device that can be touched by a user, the user device including a heat source which can generate heat; a case body covering the heat source; and a polymer-containing heat storage body attached to the case body.

This user device is such that before the heat generated by the heat source is released out of the user device through the case body, the user device may store the heat in the polymer-containing heat storage body for the time being. Then, the heat stored in the polymer-containing heat storage body is slowly released out of the user device. As such, in the user device, the polymer-containing heat storage body may take on a role of assisting heat dissipation and may also lower the speed of temperature increase caused by heat generation of the heat source. Therefore, the user device may suppress rapid release of the heat generated by the heat source.

With regard to the user device, the polymer-containing heat storage body may be attached to the surface adjacent to the heat source of the case body. In this case, the user device may store the heat on the inner side of the case body where it will not be easily touched by the user.

The user device may be a portable terminal that is carried by the user. In this case, rapid release of the heat generated by a heat source in a portable terminal carried by a user may be suppressed.

The user device may be a wearable terminal worn on a body of the user. In this case, rapid release of the heat generated by a heat source in a wearable terminal worn by a user may be suppressed.

With regard to the user device, the polymer-containing heat storage body may be attached to a part facing the body of the user in the case body and to the surface adjacent to the heat source of the case body. In this case, the wearable terminal as the user device may effectively suppress rapid release of the heat generated by the heat source to the body of the user through the case body.

The user device further includes a heat conductor connected to the heat source, and the polymer-containing heat storage body may be in contact with the heat conductor. In this case, for example, even if the heat source and the polymer-containing heat storage body are separated apart, the user device may transfer the heat generated by the heat source to the polymer-containing heat storage body through the heat conductor. As a result, the user device may effectively store the heat in the polymer-containing heat storage body.

According to another aspect of the present disclosure, there is provided a case to be fitted to a user device which includes a heat source that can generate heat, and which can be touched by a user, the case including: a case body covering at least a portion of the user device; and a polymer-containing heat storage body attached to the case body.

This case is such that before the heat generated by the heat source of the user device is released out of the case, the case may store the heat in the polymer-containing heat storage body for the time being. Then, the heat stored in the polymer-containing heat storage body is slowly released out of the case. As such, in the case, the polymer-containing heat storage body may take on a role of assisting the heat dissipation of the heat source of the user device and may also lower the speed of temperature increase caused by heat generation. Therefore, the case may suppress rapid release of the heat generate by the heat source of the user device.

Advantageous Effects of Invention

According to various embodiments of the present disclosure, rapid release of heat generated by a heat source can be suppressed.

DESCRIPTION OF EMBODIMENTS

Hereinafter, embodiments of the present disclosure will be described with reference to the drawings. Incidentally, the same reference numeral will be assigned to the same elements in the description of the drawings, and any overlapping description will not be repeated.

First Embodiment

Figure 1:
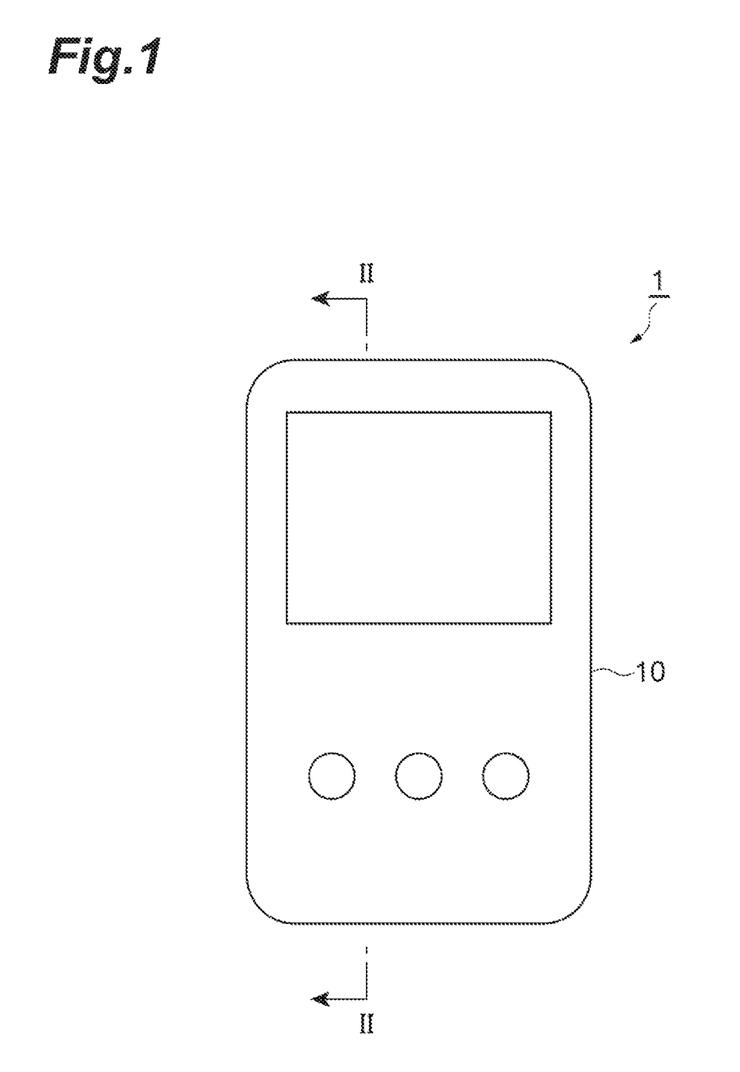
FIG. 1 is a front view illustrating an outline configuration of a user device according to a first embodiment.
Figure 2:
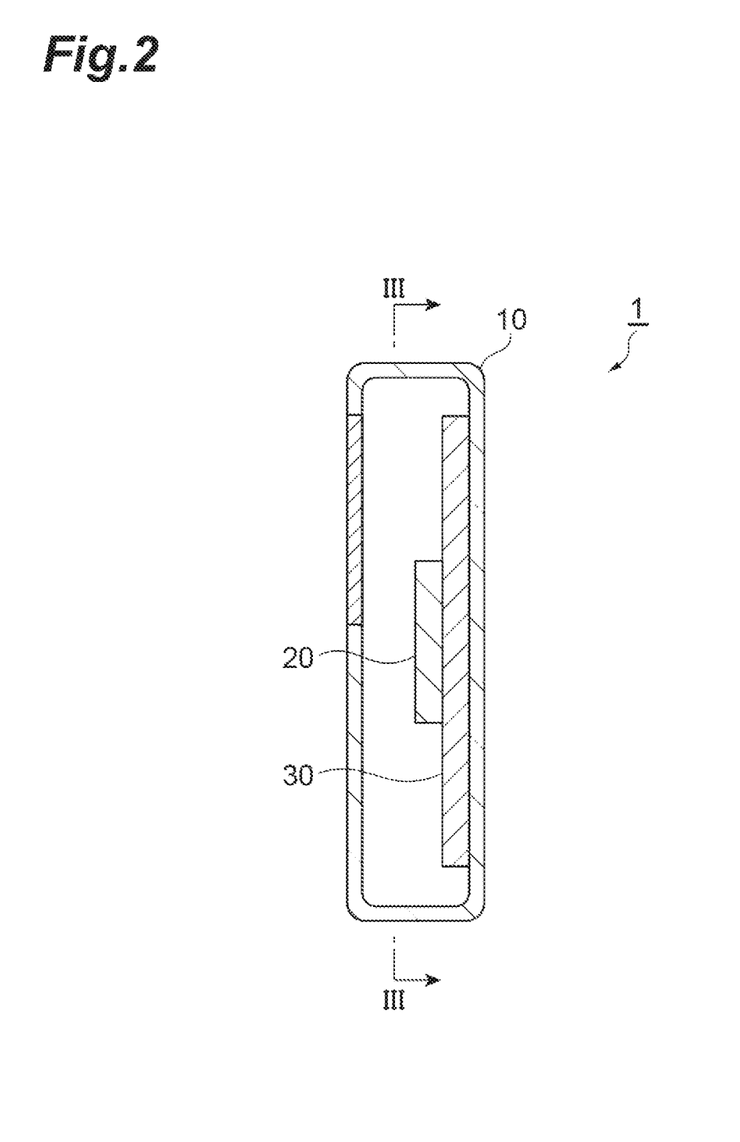
FIG. 2 is a cross-sectional view taken along the line II-II in FIG. 1.
Figure 3:
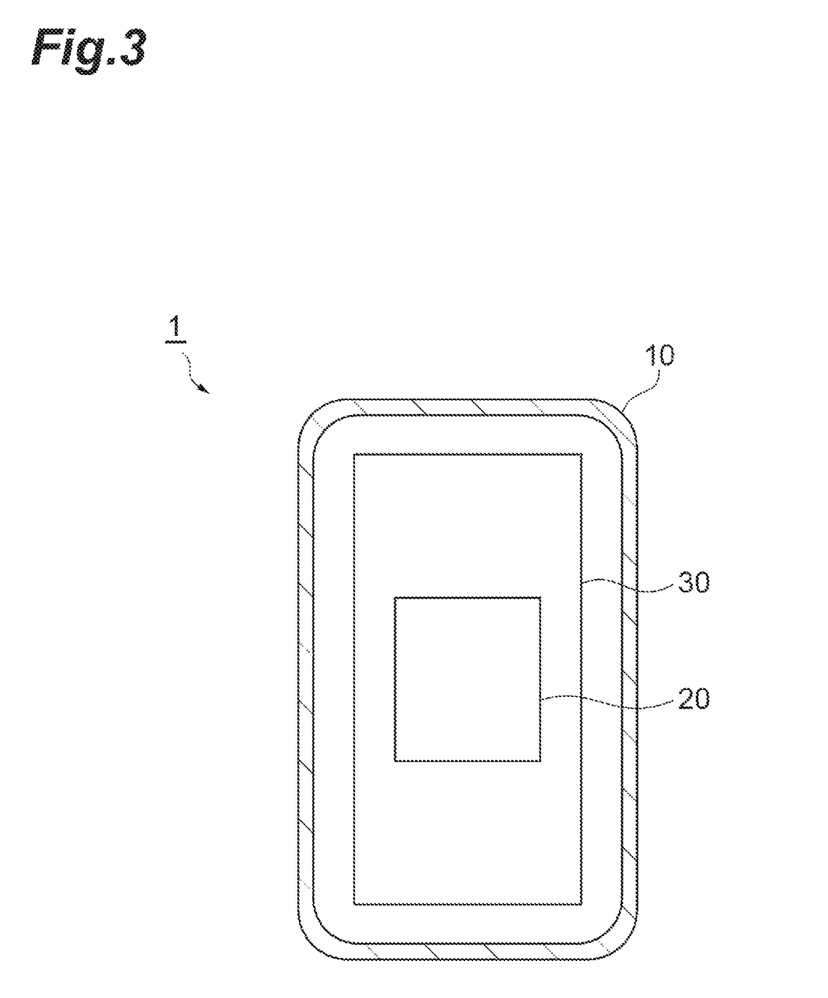
FIG. 3 is a cross-sectional view taken along the line III-III in FIG. 2.

As shown in FIG. 1 to FIG. 3, a user device 1 according to a first embodiment is a portable terminal carried by a user. The user device 1 may be touched by the user at the time of being carried or used. The user device 1 may be, for example, a communication terminal such as a smartphone, a mobile telephone, or a mobile router. The user device 1 may be, for example, a medical instrument carried by a user in order to constantly record measurement results such as the heart rate, blood pressure, and electrocardiogram of the user. Regarding the user device 1, the type of the device is not limited as long as it is carried by the user.

The user device 1 includes a case body 10, a heat source 20, and a polymer-containing heat storage body 30. The case body 10 is a box-shaped member having a housing space inside. The case body 10 houses the heat source 20 and the polymer-containing heat storage body 30 inside. That is, the case body 10 covers the periphery of the heat source 20 and the polymer-containing heat storage body 30. The material of the case body 10 is not particularly limited.

The heat source 20 can generate heat. The heat source 20 may be, for example, a semiconductor chip, a display, a light emitting unit, an electric motor, or an electric pump. The heat source 20 is not particularly limited as long as it can generate heat.

According to the present embodiment, the heat source 20 is in direct contact with the polymer-containing heat storage body 30. As a result, the heat generated by the heat source 20 is directly transferred to the polymer-containing heat storage body 30. Incidentally, the heat source 20 is not limited to being in direct contact with the polymer-containing heat storage body 30. The heat source 20 may be in a state of being isolated from the polymer-containing heat storage body 30. In this case, the heat generated by the heat source 20 may be transferred to the polymer-containing heat storage body 30 by radiant heat.

The polymer-containing heat storage body 30 can store the heat generated by the heat source 20 for the time being. Then, the heat stored in the polymer-containing heat storage body 30 is slowly released out of the polymer-containing heat storage body 30.

The polymer-containing heat storage body 30 is attached to the case body 10. According to the present embodiment, the polymer-containing heat storage body 30 is fitted to the inner surface of the case body 10 (surface adjacent to the heat source 20 of the case body 10). The polymer-containing heat storage body 30 may be attached (fixed) to the case body 10 by means of an engaging member such as a screw or may be attached (stuck) by an adhesive, a tacky adhesive tape, or the like. The polymer-containing heat storage body 30 may be attached to the case body 10 in a state of being in direct contact with the case body 10. The polymer-containing heat storage body 30 may also be attached to the case body 10 in a state in which another member (for example, a heat conductor such as a heat pipe, a tacky adhesive tape, or the like) is inserted between the polymer-containing heat storage body 30 and the case body 10.

For example, when a fixing member or the like for fixing the polymer-containing heat storage body 30 is attached to the case body 10, the polymer-containing heat storage body 30 may be attached to the case body 10 in a state of being isolated from the case body 10 by means of a fixing member or the like. That is, the polymer-containing heat storage body 30 may be attached to the case body 10, with a fixing member or the like interposed therebetween. For example, when the heat source 20 is attached to the case body 10, the polymer-containing heat storage body 30 may be attached to the heat source 20. That is, the polymer-containing heat storage body 30 may be attached to the case body 10, with the heat source 20 interposed therebetween.

According to the present embodiment, the polymer-containing heat storage body 30 is formed into a rectangular plate shape. The polymer-containing heat storage body 30 is attached to one flat surface portion of the inner surface of the case body 10. However, the polymer-containing heat storage body 30 is not limited to being formed into a rectangular plate shape. Furthermore, the polymer-containing heat storage body 30 may be attached over a plurality of flat surface portions on the inner surface of the case body 10. According to the present embodiment, one flat surface portion of the polymer-containing heat storage body 30 is in contact with one flat surface portion of the heat source 20.

The polymer-containing heat storage body 30 according to the present embodiment contains at least a polymer. More particularly, the polymer-containing heat storage body 30 may be, for example, a cured product of a curable composition containing a polymer including a structural unit represented by the following Formula (1-1) and a structural unit represented by the following Formula (1-2), and a curing agent. In this case, the polymer has heat storage properties, and the heat storage properties of the polymer-containing heat storage body 30 are exhibited thereby, (1-1)

(1-2)

wherein $R^1$ and $R^3$ each independently represent a hydrogen atom or a methyl group; $R^2$ represents an alkyl group having 12 to 30 carbon atoms or a monovalent group having a polyoxyalkylene chain; and $R^4$ represents a hydrogen atom or a monovalent organic group having a reactive group. The reactive group is a group that may react with the above-described curing agent.

When $R^2$ is an alkyl group, the alkyl group may be a linear shape or a branched shape. The number of carbon atoms of the alkyl group represented by $R^2$ is preferably 12 to 28. When IV is a group having a polyoxyalkylene chain, the group having a polyoxyalkylene chain may be a group represented by the following Formula (2):

$$*—(R^aO)_n—R^b \qquad (2)$$

wherein $R^a$ represents an alkylene group having 2 to 4 carbon atoms; n represents an integer from 2 to 90; $R^b$ represents a hydrogen atom or an alkyl group having 1 to 18 carbon atoms; and the symbol * represents a linking bond.

The reactive group for $R^4$ is, for example, at least one group selected from the group consisting of a carboxyl group, a hydroxyl group, a blocked isocyanate group, an amino group, and an epoxy group. The curing agent is appropriately selected according to the type of the reactive group for $R^4$ and may be, for example, an isocyanate compound, a phenol compound, an amine compound, an imidazole compound, an acid anhydride, or a carboxylic acid compound.

The polymer-containing heat storage body 30 may be, for example, a cured product of a curable composition containing a compound having an isocyanate group and a capsule enclosing a heat storage component (heat storage capsule). In this case, the heat storage properties of the polymer-containing heat storage body 30 are exhibited by the heat storage capsule.

The compound having an isocyanate group may be a diisocyanate having two isocyanate groups in the molecule and may be, for example, an aromatic diisocyanate, an aliphatic diisocyanate, or an alicyclic diisocyanate.

The compound having an isocyanate group may be, for example, a polymer including a structural unit represented by the above-described Formula (1-1) and a structural unit represented by the following Formula (1-3):

(1-3)

wherein $R^5$ represents a hydrogen atom or a methyl group; and $R^6$ represents a monovalent organic group having an isocyanate group.

Since this polymer is a polymer having heat storage properties, in this case, the curable composition does not have to contain the above-described heat storage capsule.

The heat storage capsule has a heat storage component and an outer shell (shell) enclosing the heat storage component. The heat storage component may be any component capable of storing heat and may be, for example, a component having heat storage properties associated with phase transition.

The heat storage component in the heat storage capsule may be, for example, an organic compound such as a chain-like saturated hydrocarbon compound (paraffin-based hydrocarbon compound), natural wax, a petroleum wax, a polyethylene glycol, or a sugar alcohol; or an inorganic compound such as a hydrate of an inorganic compound or an inorganic compound exhibiting a change in crystal structure. Preferably, the outer shell may be formed from a melamine resin, an acrylic resin, a urethane resin, silica, or the like.

The polymer-containing heat storage body 30 may be, for example, a cured product of a curable composition containing a compound having a (meth)acryloyl group, a compound having an epoxy group, or a compound having a blocked isocyanate group; a curing agent; and the above-described heat storage capsule. In this case, the heat storage properties of the polymer-containing heat storage body 30 are exhibited by the heat storage capsule.

The compound having a (meth)acryloyl group may include, for example, a compound represented by the following Formula (3):

(3)

wherein $R^7$ represents a hydrogen atom or a methyl group; and $R^8$ represents a monovalent organic group.

The monovalent organic group represented by $R^8$ may be, for example, a hydrocarbon group such as an alkyl group, a cycloalkyl group, or an aromatic hydrocarbon group; a group having an oxygen atom, such as a group having a polyoxyalkylene chain, a heterocyclic ring-containing group, or an alkoxy group; a group containing a silicon atom, such as a group having a silane group, or a group having a siloxane bond; or a group containing a halogen atom such as a fluorine atom.

The compound having a (meth)acryloyl group may be polyacrylic (meth)acrylate, polyurethane (meth)acrylate, polyester (meth)acrylate, a polyether (meth)acrylate, a polyepoxy (meth)acrylate, a polybutadiene having (meth)acrylic-modified terminals, or the like.

When the curable composition contains a compound having a (meth)acryloyl group, the curing agent may be a curing agent (polymerization initiator) that generates radicals by means of heat, light, or an anaerobic atmosphere.

The compound having an epoxy group may be, for example, a compound having an epoxy group and an aromatic ring or may be a compound (glycidylation product) in which an amino group and a hydroxyl group of a compound having either or both of an amino group and a hydroxyl group and an aromatic ring have been glycidylated.

When the curable composition contains a compound having an epoxy group, the curing agent may be, for example, at least one selected from the group consisting of a phenol compound, an amine compound, an imidazole compound, and an acid anhydride.

The compound having a blocked isocyanate group has an isocyanate group blocked (protected) by a blocking agent (protective group) that can be eliminated by heat. The compound having a blocked isocyanate group is the above-described compound having an isocyanate group, in which the isocyanate group is protected by a blocking agent.

When the curable composition contains a compound having a blocked isocyanate group, the curing agent may be, for example, at least one selected from the group consisting of an alcohol compound, an amine compound, and a thiol compound.

The polymer-containing heat storage body 30 may be, for example, a cured product of a mixture of a first liquid containing the above-described heat storage capsule and the above-described isocyanate group; and a second liquid containing the above-described heat storage capsule and a curing agent. In this case, the heat storage properties of the polymer-containing heat storage body 30 are exhibited by the heat storage capsule.

The polymer-containing heat storage body 30 may be, for example, a cured product of a mixture of a first liquid containing the above-described heat storage capsule and the above-described compound having an epoxy group; and a second liquid containing the above-described heat storage capsule and a curing agent. In this case, the heat storage properties of the polymer-containing heat storage body 30 are exhibited by the heat storage capsule. The curing agent may be, for example, at least one selected from the group consisting of a thiol compound and an amine compound.

The polymer-containing heat storage body 30 may be, for example, a cured product of a mixture of a first liquid containing the above-described heat storage capsule, the above-described compound having a (meth)acryloyl group, and an oxidizing agent; and a second liquid containing the above-described heat storage capsule, the above-described compound having a (meth)acryloyl group, and a reducing agent. In this case, the heat storage properties of the polymer-containing heat storage body 30 are exhibited by the heat storage capsule. The oxidizing agent may be, for example, an organic peroxide or an azo compound. The reducing agent may be, for example, a tertiary amine, a thiourea derivative, or a transition metal salt.

The polymer-containing heat storage body 30 may be, for example, a heat storage body containing a copolymer of ethylene and an olefin having 3 or more carbon atoms; and at least one heat storage component selected from the group consisting of a chain-like saturated hydrocarbon compound and a fatty acid ester. The olefin having 3 or more carbon atoms may be, for example, an olefin having 3 to 8 carbon atoms or may be an olefin having 8 carbon atoms (octene). This polymer-containing heat storage body 30 may further contain a gelling agent. The gelling agent may be, for example, at least one selected from the group consisting of a carboxylic acid and a carboxylic acid metal salt.

As described above, the user device 1 is such that before the heat generated by the heat source 20 is released out of the user device 1 through the case body 10, the user device 1 can store the heat in the polymer-containing heat storage body 30 for the time being. Then, the heat stored in the polymer-containing heat storage body 30 is slowly released out of the user device 1 (case body 10). As such, in the user device 1, the polymer-containing heat storage body 30 can take on a role of assisting the heat dissipation of the heat source 20 and can also lower the speed of temperature increase caused by heat generation of the heat source 20. Therefore, the user device 1 carried by a user can suppress rapid release of the heat generated by the heat source 20. As a result, for example, even when the heat source 20 has generated heat temporarily and rapidly, the user device 1 can suppress rapid release of the heat generated by the heat source 20 such that the user does not feel hot even if the user touches the user device 1.

The polymer-containing heat storage body 30 is attached to the inner surface of the case body 10. In this case, the user device 1 can store the heat on the inner side of the case body 10 where it will not be easily touched by the user.

Meanwhile, the heat source 20 is not limited to being in direct contact with the polymer-containing heat storage body 30 as shown in FIG. 2. For example, the heat source 20 may be in contact (thermally connected) with the polymer-containing heat storage body 30, with a heat conductor 40 interposed therebetween, as in the case of the user device 1A shown in FIG. 4. That is, the user device 1A further includes a heat conductor 40 connected to the heat source 20. Then, the polymer-containing heat storage body 30 may be in contact with the heat conductor 40. The material of the heat conductor 40 is not particularly limited as long as heat transfer between the heat source 20 and the polymer-containing heat storage body 30 is enabled. The heat conductor 40 may be a band-shaped heat pipe connecting between the heat source 20 and the polymer-containing heat storage body 30. The heat conductor 40 may be a mechanism for exhausting the heat generated by the heat source 20. This mechanism for exhausting heat may be a condenser that liquefies a gas. The polymer-containing heat storage body 30 may be in contract with such a mechanism for heat exhaustion, such as a condenser.

Figure 4:
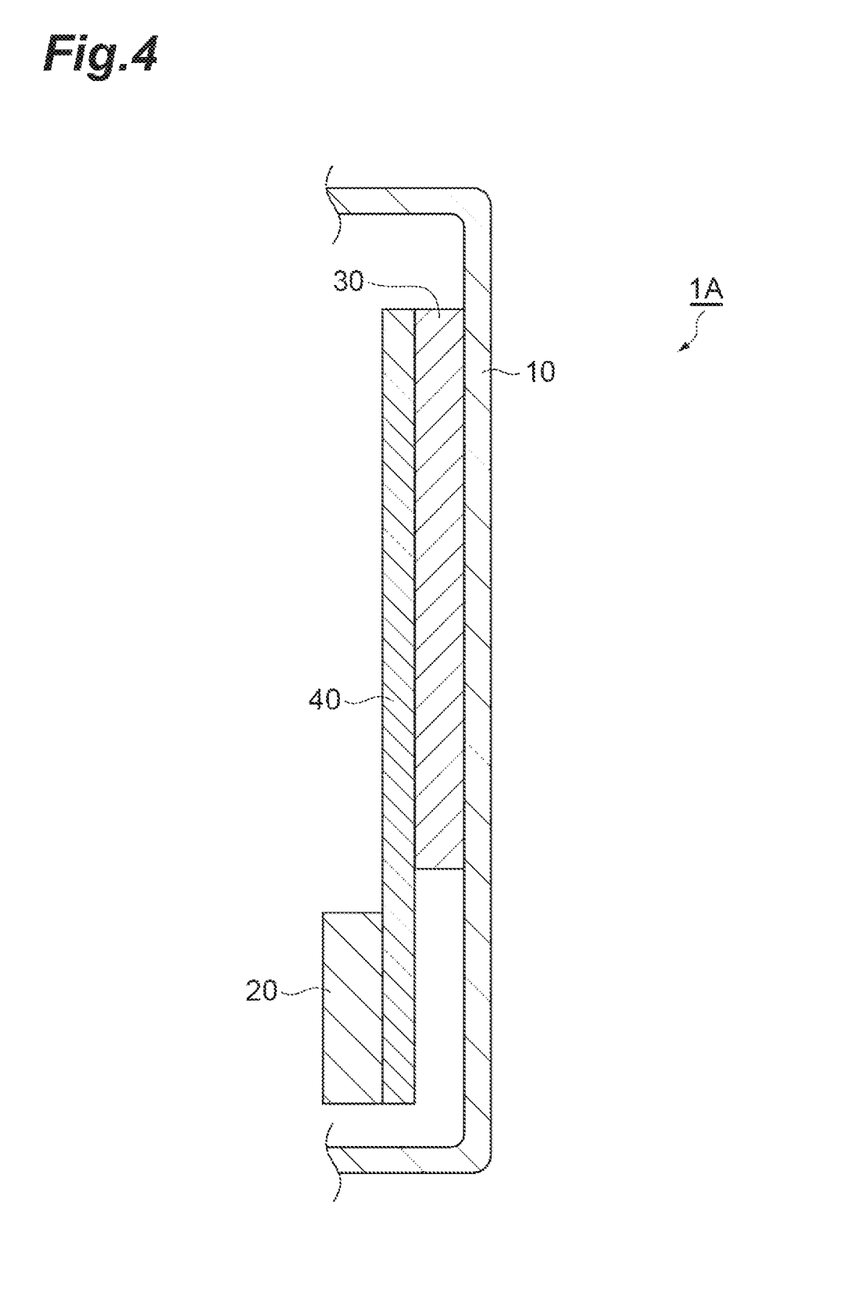
FIG. 4 is a magnified cross-sectional view around a polymer-containing heat storage body according to a modification example of the first embodiment.

As a result, even in a state in which the heat source 20 and the polymer-containing heat storage body 30 are separated apart, the heat source 20 and the polymer-containing heat storage body 30 are connected so as to be capable of transferring heat by means of the heat conductor 40. Therefore, the user device 1A can effectively store the heat in the polymer-containing heat storage body 30.

Incidentally, in FIG. 4, one flat surface portion of the heat conductor 40 is in contact with one flat surface portion of the polymer-containing heat storage body 30; however, the contact state between the heat conductor 40 and the polymer-containing heat storage body 30 is not limited to this state. For example, the polymer-containing heat storage body 30 may be in contact (connect) with the heat conductor 40 such that the entirety of one end of the heat conductor 40 is covered by the polymer-containing heat storage body 30.

Furthermore, in FIG. 2, one flat surface portion of the heat source 20 is in contact with one flat surface portion of the polymer-containing heat storage body 30; however, the contact state between the heat source 20 and the polymer-containing heat storage body 30 is not limited to this state. For example, similarly to the user device 1B shown in FIG. 5, when the heat source 20 is a semiconductor chip attached to a circuit substrate 21, the polymer-containing heat storage body 30 may be in contact with the heat source 20 so as to cover the entire exposed surface of the heat source 20 (semiconductor chip). That is, the polymer-containing heat storage body 30 may be in contact over the entire portion that is not in contact with the circuit substrate 21 in the surface of the heat source 20. In this case, the polymer-containing heat storage body 30 can further assist dissipation of the heat generated by the semiconductor chip (heat source 20).

Figure 5:
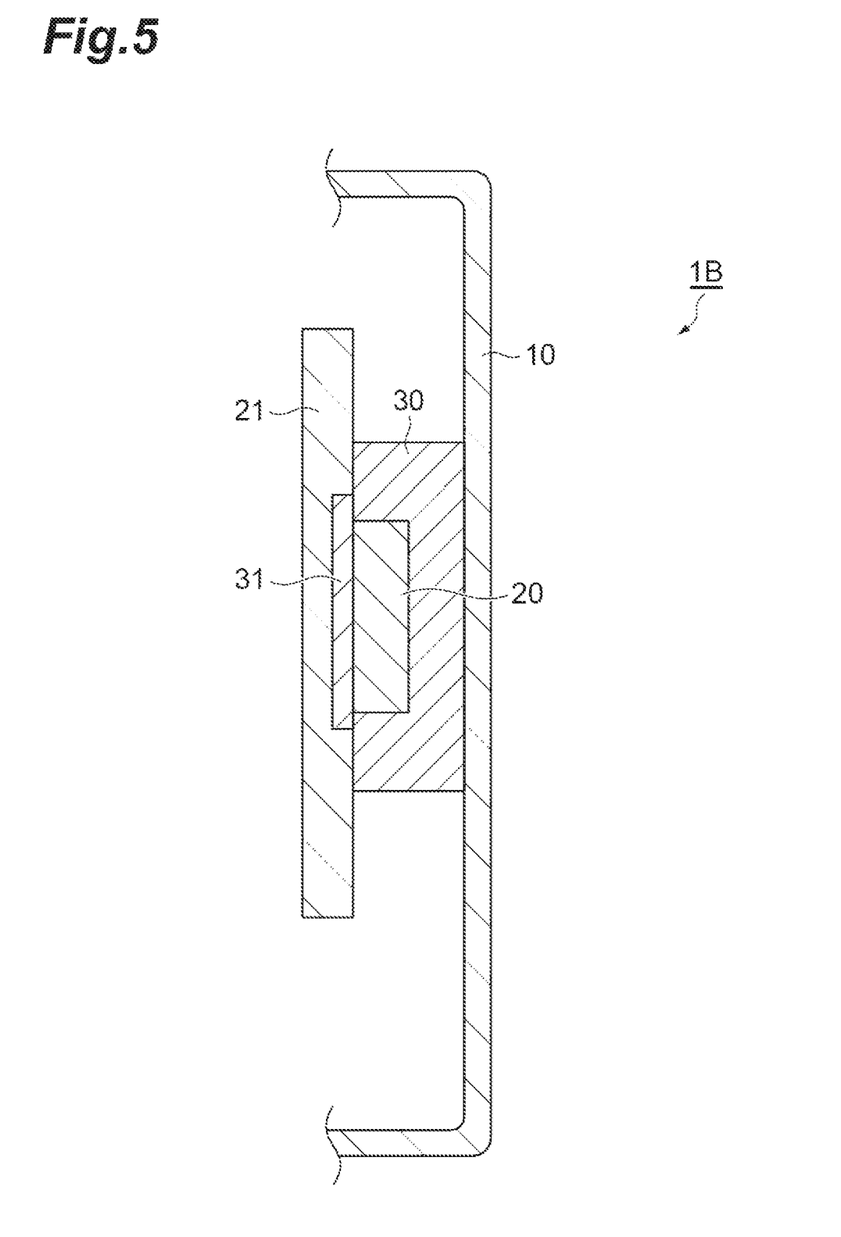
FIG. 5 is a magnified cross-sectional view around the polymer-containing heat storage body according to a modification example of the first embodiment.

Incidentally, as shown in FIG. 5, a polymer-containing heat storage body 31 may be embedded in the surface facing the heat source 20 (semiconductor chip) in the circuit substrate 21. In this case, dissipation of the heat generated by the heat source 20 (semiconductor chip) can also be assisted by the polymer-containing heat storage body 31 embedded in the circuit substrate 21.

Second Embodiment

Figure 6:
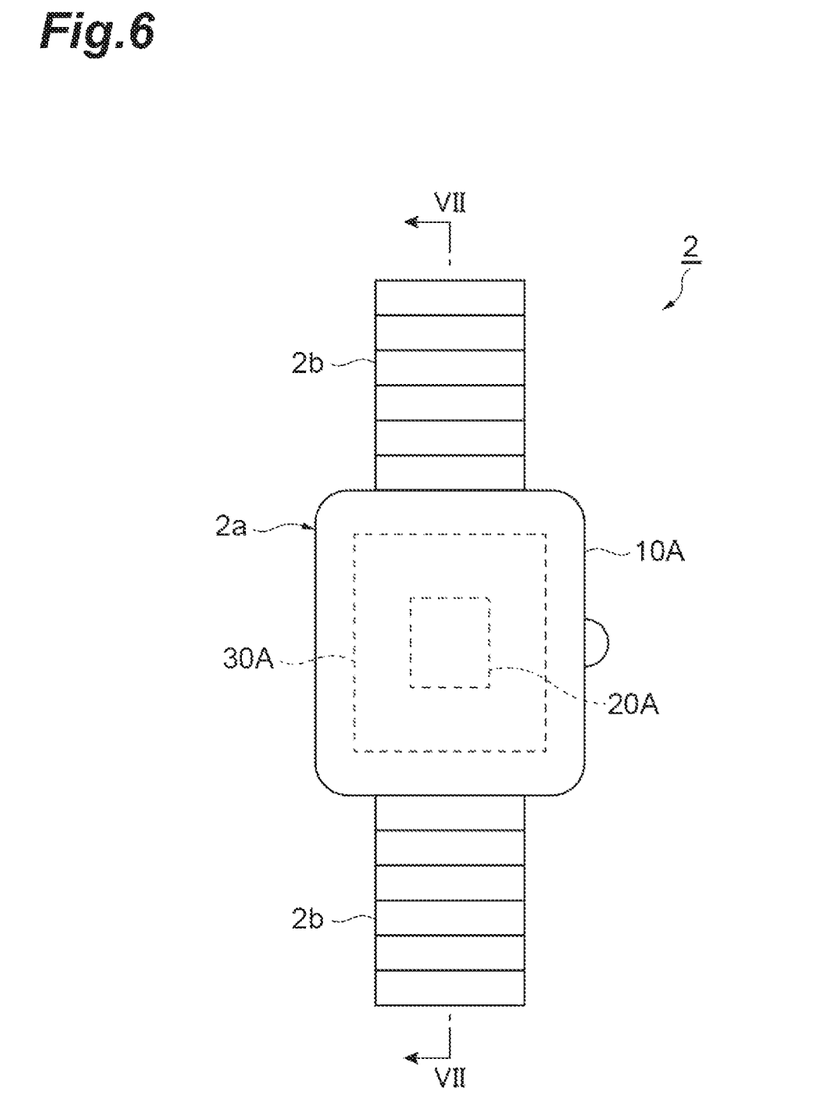
FIG. 6 is a front view illustrating an outline configuration of a user device according to a second embodiment.
Figure 7:
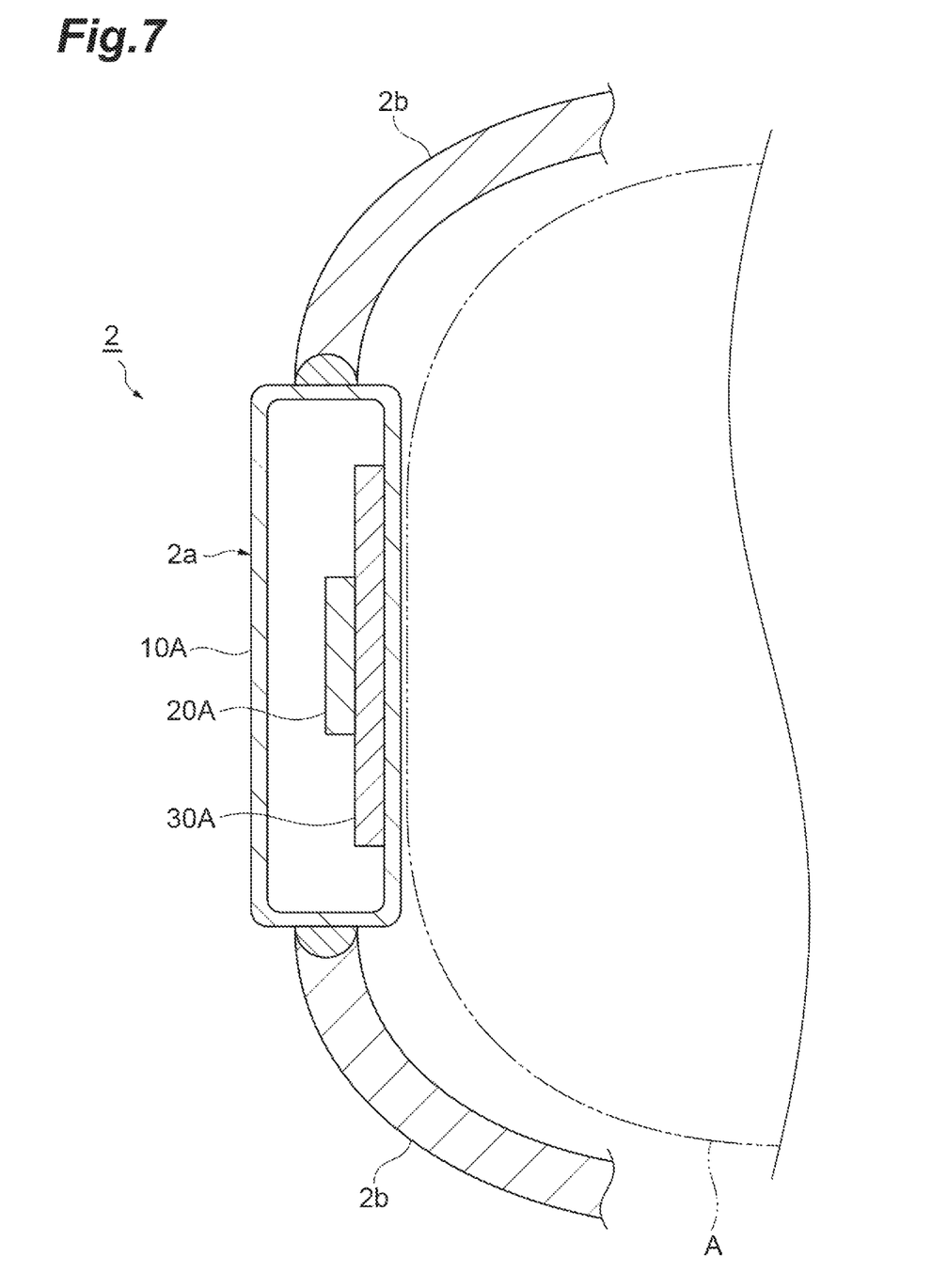
FIG. 7 is a cross-sectional view taken along the line VII-VII in FIG. 6.

As shown in FIG. 6 and FIG. 7, the user device 2 according to the second embodiment is a wearable terminal worn on a body of the user. According to the present embodiment, the user device 2 is a watch-type wearable terminal that is worn on the user's wrist. The user device 2 is in a state of being in contact with the body of the user by being worn on the body of the user. The user device 2 may be, for example, a communication terminal such as a smartphone or a mobile telephone. The user device 2 may be, for example, a medical instrument that is worn on a body of the user in order to constantly record measurement results such as the user's heart rate, blood pressure, and electrocardiogram. With regard to the user device 2, the type of the device is not limited as long as it is worn on the body of the user.

The user device 2 includes a device body 2a and a belt 2b. The belt 2b causes the device body 2a to be worn on a user's wrist by being wrapped around the user's wrist. The device body 2a includes a case body 10A, a heat source 20A, and a polymer-containing heat storage body 30A.

The case body 10A houses the heat source 20A and the polymer-containing heat storage body 30A inside. That is, the case body 10A covers the periphery of the heat source 20A and the polymer-containing heat storage body 30A. The material of the case body 10A is not particularly limited.

The heat source 20A can generate heat. The heat source 20A may be, for example, a semiconductor chip, a display, a light emitting unit, an electric motor, or an electric pump. The heat source 20A is not particularly limited as long as it can generate heat.

According to the present embodiment, the heat source 20A is in direct contact with the polymer-containing heat storage body 30A. Meanwhile, the heat source 20A is not limited to being in direct contact with the polymer-containing heat storage body 30A, similarly to the heat source 20 according to the first embodiment.

The polymer-containing heat storage body 30A can store the heat generated by the heat source 20A for the time being. Then, the heat stored in the polymer-containing heat storage body 30A is slowly released out of the polymer-containing heat storage body 30A.

The polymer-containing heat storage body 30A is attached to the case body 10A. According to the present embodiment, the polymer-containing heat storage body 30A is attached to a portion facing the user's wrist A (portion in contact with the wrist) in the case body 10A and to the inner surface of the case body 10A (surface adjacent to the heat source 20A of the case body 10A). The configuration for attaching the polymer-containing heat storage body 30A to the case body 10A is similar to the configuration for attaching the polymer-containing heat storage body 30 to the case body 10 according to the first embodiment. Furthermore, the configuration (material) of the polymer-containing heat storage body 30A is similar to the configuration of the polymer-containing heat storage body 30 according to the first embodiment.

As described above, similarly to the user device 1 according to the first embodiment, the user device 2 is such that the polymer-containing heat storage body 30A can take on a role of assisting the heat dissipation of the heat source 20A and can also lower the speed of temperature increase caused by heat generation of the heat source 20A. Therefore, the user device 2 to be worn on the body of the user can suppress rapid release of the heat generated by the heat source 20A. As a result, for example, even when the heat source 20A generates heat temporarily and rapidly, the user device 2 can suppress rapid release of the heat generated by the heat source 20A so that the user does not feel hot.

In the user device 2, the polymer-containing heat storage body 30A is attached to a portion facing the user's wrist A in the case body 10A and to the inner surface of the case body 10A. In this case, the user device 2 can effectively suppress the heat generated by the heat source 20A from being rapidly released to the body of the user (wrist A) through the case body 10A.

Third Embodiment

Figure 8:
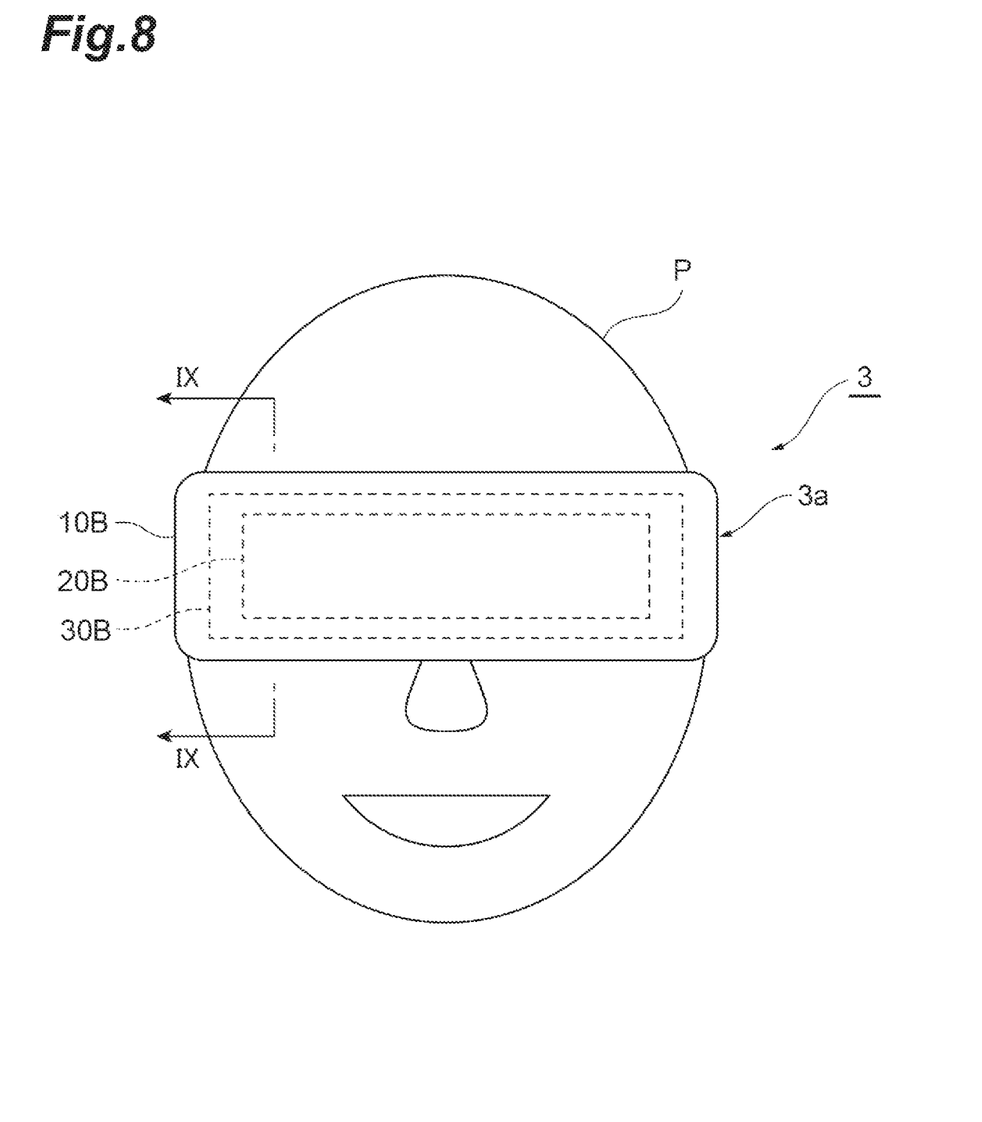
FIG. 8 is a front view illustrating an outline configuration of a user device according to a third embodiment.
Figure 9:
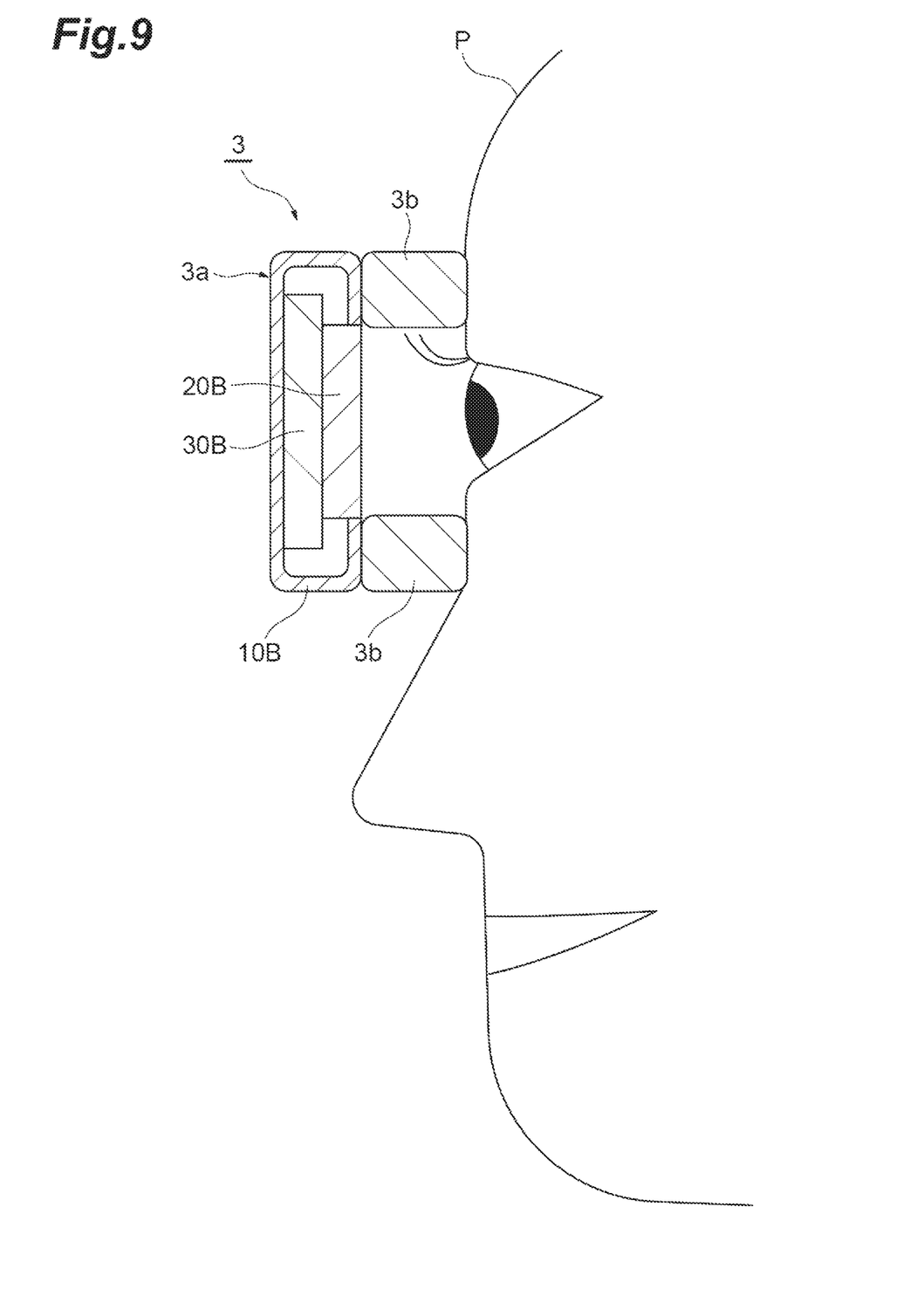
FIG. 9 is a cross-sectional view taken along the line IX-IX in FIG. 8.

As shown in FIG. 8 and FIG. 9, a user device 3 according to a third embodiment is a wearable terminal that is worn on user P's body. According to the present embodiment the user device 3 is a head-mounted display that is worn on the user P's head. The user device 3 is in a state of being touched by the user P's body by being worn on the user P's head.

The user device 3 includes a display body 3a and a cushion 3b. The display body 3a is fixed to the user P's head so as to be positioned in front of the user P's eyes by means of a fixing belt or the like, which is not shown in the diagram. The cushion 3b is attached to the display body 3a. The display body 3a is in contact with the user P's head, with the cushion 3b interposed therebetween. The display body 3a includes a case body 10B, a display (heat source) 20B, and a polymer-containing heat storage body 30B.

The case body 10B houses the display 20B and the polymer-containing heat storage body 30B. That is, the case body 10B covers the periphery of the display 20B and the polymer-containing heat storage body 30B. The material of the case body 10B is not particularly limited. Meanwhile, the display surface of the display 20B is exposed through an opening of the case body 10B so as to enable visual recognition by the user P.

The display 20B can generate heat when an image or the like is displayed. The type of the display 20B is not particularly limited.

According to the present embodiment, the back surface (surface on the opposite side of the display surface) of the display 20B is in direct contact with the polymer-containing heat storage body 30B. Incidentally, the display 20B is not limited to being in direct contact with the polymer-containing heat storage body 30B, similarly to the heat source 20 according to the first embodiment.

The polymer-containing heat storage body 30B can store the heat generated by the display 20B for the time being. Then, the heat stored in the polymer-containing heat storage body 30B is slowly released out of the polymer-containing heat storage body 30B.

The polymer-containing heat storage body 30B is attached to the case body 10B. According to the present embodiment, the configuration for attaching the polymer-containing heat storage body 30B to the case body 10B is similar to the configuration for attaching the polymer-containing heat storage body 30 to the case body 10 according to the first embodiment. Furthermore, the configuration of the polymer-containing heat storage body 30B is similar to the configuration of the polymer-containing heat storage body 30 according to the first embodiment.

As described above, in the user device 3, the polymer-containing heat storage body 30B can take on a role of assisting the heat dissipation of the display 20B and can also lower the speed of temperature increase caused by heat generation of the display 20B, similarly to the user device 1 according to the first embodiment. Therefore, the user device 3 that is attached to the user P's head can suppress rapid release of the heat generated by the display 20B.

Incidentally, the polymer-containing heat storage body 30B may be configured to store the heat of other heat sources such as a semiconductor chip provided in the user device 3 instead of the display 20B for the time being.

Furthermore, the user device is not limited to being carried by or worn on a user as in the cases of the portable terminals and wearable terminals described in the first to third embodiments. The user device may be a device (device that may be touched) used by a user in a state of being installed on the ground or a support unit such as a table.

For example, the user device may be a medical instrument that may be touched by a user. This medical instrument may be, for example, a sphygmomanometer that is installed on a table and measures the blood pressure of a user in a state in which the user's arm is placed through a tubular-shaped pressurizing part. In this case, for example, the above-mentioned polymer-containing heat storage body may be provided inside the case body of the pressurizing part through which the user's arm is placed. As a result, for example, even if heat is generated by the pressurizing mechanism (for example, an air pump) of the pressurizing part, before the generated heat is transferred toward the user's arm from the pressurizing part, the heat can be stored in the polymer-containing heat storage body for the time being. As a result, the user device as a sphygmomanometer can suppress rapid release of the heat generated by a heat source such as a pressurizing mechanism.

As described above, the user device may be various devices having heat sources. Furthermore, the above-mentioned polymer-containing heat storage body may be attached to the case body of such a user device having a heat source.

Fourth Embodiment

Figure 10:
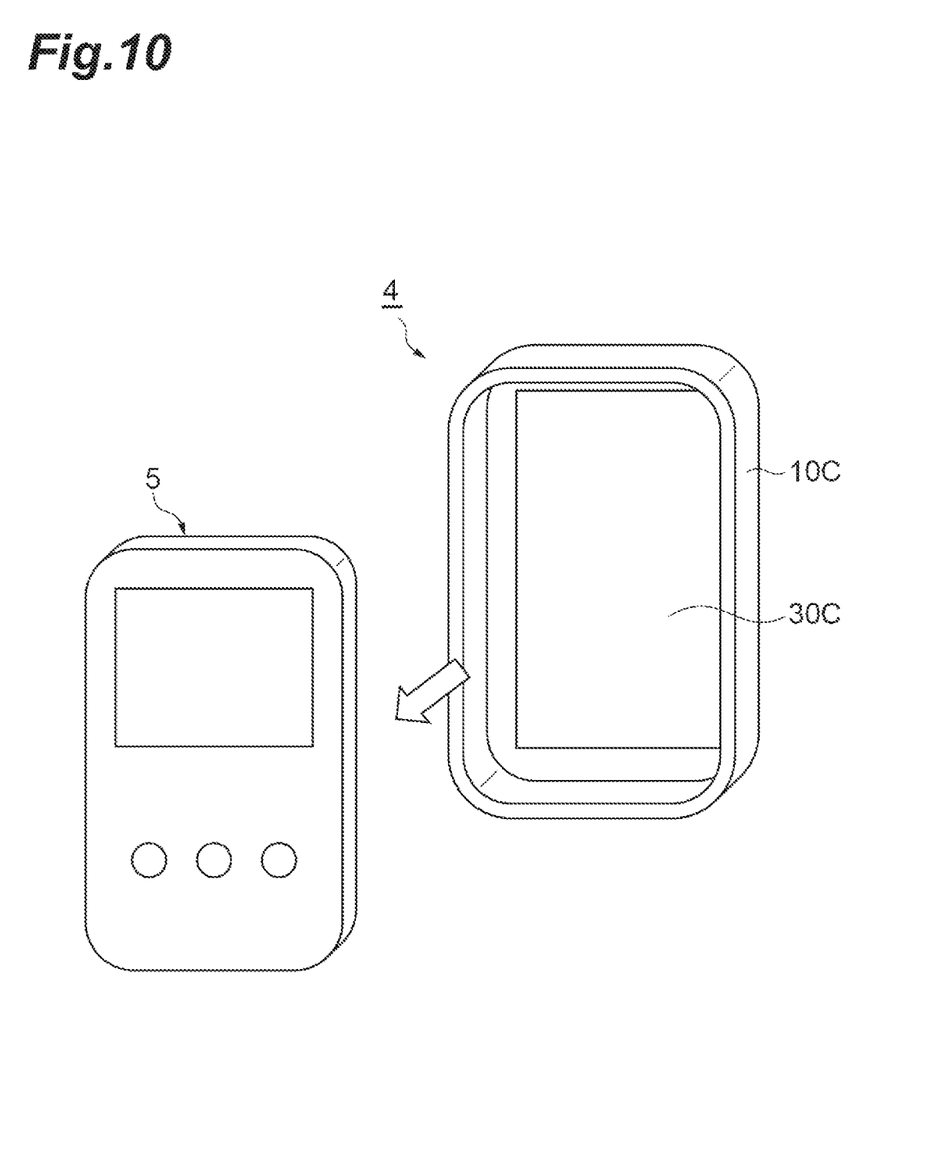
FIG. 10 is a front view illustrating an outline configuration of a case according to a fourth embodiment.
Figure 11:
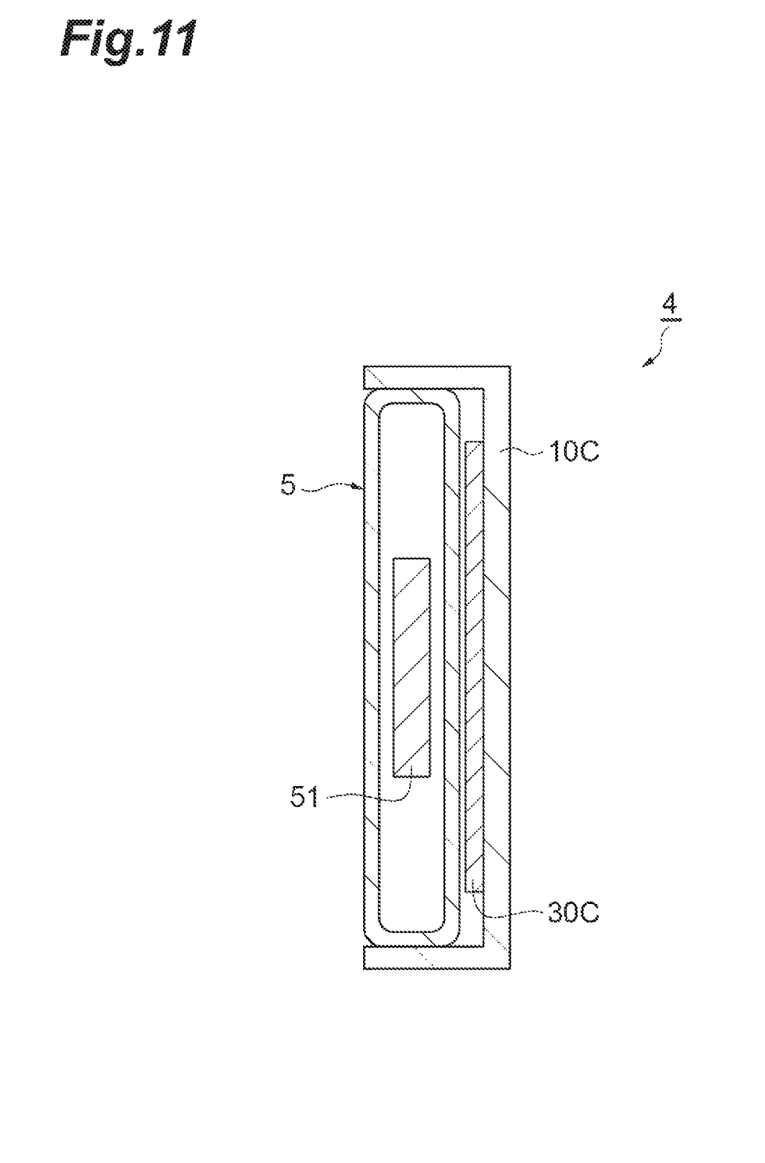
FIG. 11 is a cross-sectional view of the case in FIG. 10.

Next, an embodiment of a case that is fitted to a user device including a heat source that can generate heat will be described. As shown in FIG. 10 and FIG. 11, a case 4 is fitted to a user device 5. The user device 5 is a device that may be touched by a user and includes a heat source 51 that generates heat. The user device 5 may be various devices such as the portable terminals and the wearable terminals described in the first to third embodiments. In FIG. 10 and FIG. 11, a portable terminal as the user device 5 is shown as an example.

The case 4 includes a case body 10C and a polymer-containing heat storage body 30C. According to the present embodiment, the case body 10C is fitted to the user device 5 so as to cover the back surface of the user device 5. However, it is desirable that the case body 10C covers at least a portion of the user device 5. The material of the case body 10C is not particularly limited. Furthermore, various configurations may be employed for the configuration for fitting (fixing) the case body 10C to the user device 5.

The polymer-containing heat storage body 30C can store the heat generated by the heat source 51 of the user device 5 for the time being. Then, the heat stored in the polymer-containing heat storage body 30C is slowly released out of the polymer-containing heat storage body 30C.

The polymer-containing heat storage body 30C is attached to the case body 10C. According to the present embodiment, the polymer-containing heat storage body 30C is attached to the surface facing the user device 5 in the case body 10C. The configuration for attaching the polymer-containing heat storage body 30C to the case body 10C is similar to the configuration for attaching the polymer-containing heat storage body 30 to the case body 10 according to the first embodiment. Furthermore, the configuration of the polymer-containing heat storage body 30C is similar to the configuration of the polymer-containing heat storage body 30 according to the first embodiment.

According to the present embodiment, the polymer-containing heat storage body 30C may be in close contact with the case body 10C of the user device 5 in a state in which the case 4 is fitted to the user device 5, or may be separated apart from the case body 10C.

As described above, the case 4 that is fitted to the user device 5 is such that before the heat generated by the heat source 51 of the user device 5 is released out of the case 4, the case 4 can store the heat in the polymer-containing heat storage body 30C for the time being. Then, the heat stored in the polymer-containing heat storage body 30C is slowly released out of the case 4. As such, in the case 4, the polymer-containing heat storage body 30C can take on a role of assisting the heat dissipation of the heat source 51 of the user device 5 and can also lower the speed of temperature increase caused by heat generation. Therefore, the case 4 can suppress the heat generated by the heat source 51 of the user device 5 from being rapidly released out of the case 4. As a result, for example, even if the heat source 51 of the user device 5 has generated heat temporarily and rapidly, the case 4 can suppress the rapid release of the heat generated by the heat source 51 so that a user touching the case 4 does not feel hot.

Thus, embodiments of the present disclosure have been described; however, the present disclosure is not limited to the above-described embodiments, and various modifications can be made.

REFERENCE SIGNS LIST 1, 1A, 1B, 2, 3, 5: user device, 4: case, 10, 10A, 10B, 10C: case body, 20, 20A, 51: heat source, 20B: display (heat source), 30, 30A, 30B, 30C: polymer-containing heat storage body, 40: heat conductor, P: user.

The invention claimed is:

1. A user device configured to be touched by a user, the user device comprising:
a heat source configured to generate heat;
a case body covering the heat source; and
a polymer-containing heat storage body attached to the case body,
wherein the polymer-containing heat storage body is a cured product of a curable composition containing:
a curing agent and
a polymer having heat storage property and including a structural unit represented by the following Formula (1-1) and a structural unit represented by the following Formula (1-2):

(1-1)

(1-2)

wherein $R^1$ and $R^3$ each independently represent a hydrogen atom or a methyl group; $R^2$ represents an alkyl group having 12 to 30 carbon atoms or a monovalent group having a polyoxyalkylene chain; and $R^4$ represents a hydrogen atom or a monovalent organic group having a reactive group.

2. The user device according to claim 1, wherein the polymer-containing heat storage body is attached to a surface adjacent to the heat source of the case body.

3. The user device according to claim 1, wherein the user device is a portable terminal carried by the user.

4. The user device according to claim 1, wherein the user device is a wearable terminal to be worn on a body of the user.

5. The user device according to claim 4, wherein the polymer-containing heat storage body is attached to a portion of the case body facing the body of the user and to a surface adjacent to the heat source of the case body.

6. The user device according to claim 1,
wherein the user device further comprises a heat conductor connected to the heat source, and
wherein the polymer-containing heat storage body is in contact with the heat conductor.

7. A case of a user device, the case comprising:
a case body covering at least a portion of the user device; and
a polymer-containing heat storage body attached to the case body,
wherein the case is configured to be fitted to the user device which includes a heat source configured to generate heat, and which configured to be touched by a user, and
wherein the polymer-containing heat storage body is a cured product of a curable composition containing:
a curing agent and
a polymer having heat storage property and including a structural unit represented by the following Formula (1-1) and a structural unit represented by the following Formula (1-2):

(1-1)

(1-2)

wherein $R^1$ and $R^3$ each independently represent a hydrogen atom or a methyl group; $R^2$ represents an alkyl group having 12 to 30 carbon atoms or a monovalent group having a polyoxyalkylene chain; and $R^4$ represents a hydrogen atom or a monovalent organic group having a reactive group.

8. The user device according to claim 1, wherein a first surface of the polymer-containing heat storage body abuts the heat source, and a second surface of the polymer-containing heat storage body opposite to the first surface abuts the case body.

9. The user device according to claim 6, wherein a first surface of the polymer-containing heat storage body abuts the heat conductor, and a second surface of the polymer-containing heat storage body opposite to the first surface abuts the case body.

10. The case according to claim 7, wherein a first surface of the polymer-containing heat storage body faces the user device, and a second surface of the polymer-containing heat storage body opposite to the first surface abuts the case body.

* * * * *